(12) United States Patent
Noda et al.

(10) Patent No.: US 11,437,388 B2
(45) Date of Patent: Sep. 6, 2022

(54) SEMICONDUCTOR MEMORY DEVICE AND METHOD OF MANUFACTURING SEMICONDUCTOR MEMORY DEVICE

(71) Applicant: Kioxia Corporation, Minato-ku (JP)

(72) Inventors: Kosei Noda, Yokkaichi (JP); Go Oike, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 106 days.

(21) Appl. No.: 16/987,732

(22) Filed: Aug. 7, 2020

(65) Prior Publication Data

US 2021/0091101 A1 Mar. 25, 2021

(30) Foreign Application Priority Data

Sep. 19, 2019 (JP) .............................. JP2019-170456

(51) Int. Cl.
*H01L 27/11524* (2017.01)
*H01L 27/11551* (2017.01)
*H01L 27/1157* (2017.01)
*H01L 27/11565* (2017.01)
*H01L 27/11519* (2017.01)
*H01L 27/11578* (2017.01)

(52) U.S. Cl.
CPC .... *H01L 27/11551* (2013.01); *H01L 27/1157* (2013.01); *H01L 27/11519* (2013.01); *H01L 27/11524* (2013.01); *H01L 27/11565* (2013.01); *H01L 27/11578* (2013.01)

(58) Field of Classification Search
CPC ......... H01L 27/11551; H01L 27/11519; H01L 27/11524; H01L 27/11565; H01L 27/1157; H01L 27/11578; H01L 27/11573; H01L 27/11575; H01L 27/11582; H01L 27/11556

See application file for complete search history.

(56) References Cited

U.S. PATENT DOCUMENTS 10,199,511 B1 * 2/2019 Nakaki ............. H01L 27/11582
2014/0061776 A1 * 3/2014 Kwon ............... H01L 27/11582
257/329

(Continued)

FOREIGN PATENT DOCUMENTS

JP 2019-67825 A 4/2019

*Primary Examiner* — Shahed Ahmed
*Assistant Examiner* — Khatib A Rahman
(74) *Attorney, Agent, or Firm* — Oblon, McClelland, Maier & Neustadt, L.L.P.

(57) ABSTRACT

A semiconductor memory device includes a substrate, a first stack, a plurality of first columnar portions, a second stack, a plurality of second columnar portions, and a third stack. In the first stack, first conductive layers and first insulating layers are alternately stacked in a thickness direction of the substrate. Each of the plurality of first pillars extends inside the first stack in the thickness direction. In the second stack, second conductive layers and second insulating layers are alternately stacked in the thickness direction. Each of the plurality of second pillars extends inside the second stack in the thickness direction. The third stack is positioned between the first stack and the second stack in the first direction. In the third stack, third insulating layers and fourth insulating layers including a material different from a material of the third insulating layer are alternately stacked in the thickness direction of the substrate.

14 Claims, 12 Drawing Sheets

(56) References Cited

U.S. PATENT DOCUMENTS

| | | | |
|---|---|---|---|
| 2015/0236038 A1* | 8/2015 | Pachamuthu | H01L 21/8221 257/326 |
| 2017/0062461 A1* | 3/2017 | Takamatsu | H01L 28/40 |
| 2017/0069655 A1* | 3/2017 | Ichinose | H01L 27/11556 |
| 2018/0277563 A1* | 9/2018 | Tsunoda | H01L 27/1157 |
| 2019/0096899 A1 | 3/2019 | Tagami et al. | |
| 2019/0139972 A1* | 5/2019 | Shimojo | H01L 27/11582 |
| 2019/0287985 A1* | 9/2019 | Shimojo | H01L 23/5226 |
| 2019/0287995 A1* | 9/2019 | Oike | H01L 27/11524 |
| 2019/0296038 A1* | 9/2019 | Noda | H01L 27/11582 |
| 2020/0227431 A1* | 7/2020 | Nagashima | H01L 27/11565 |
| 2020/0312863 A1* | 10/2020 | Iwai | H01L 27/11524 |
| 2020/0394501 A1* | 12/2020 | Chen | H01L 28/20 |
| 2021/0066337 A1* | 3/2021 | Xia | H01L 27/11519 |

\* cited by examiner

US 11,437,388 B2

SEMICONDUCTOR MEMORY DEVICE AND METHOD OF MANUFACTURING SEMICONDUCTOR MEMORY DEVICE

CROSS-REFERENCE TO RELATED APPLICATION

This application is based upon and claims the benefit of priority from Japanese Patent Application No. 2019-170456, filed Sep. 19, 2019; the entire contents of which are incorporated herein by reference.

FIELD

Embodiments described herein relate generally to a semiconductor memory device and a method for manufacturing a semiconductor memory device.

BACKGROUND

There have been developed NAND memory devices with three dimensional memory cell stacks.

DETAILED DESCRIPTION

Figure 1:
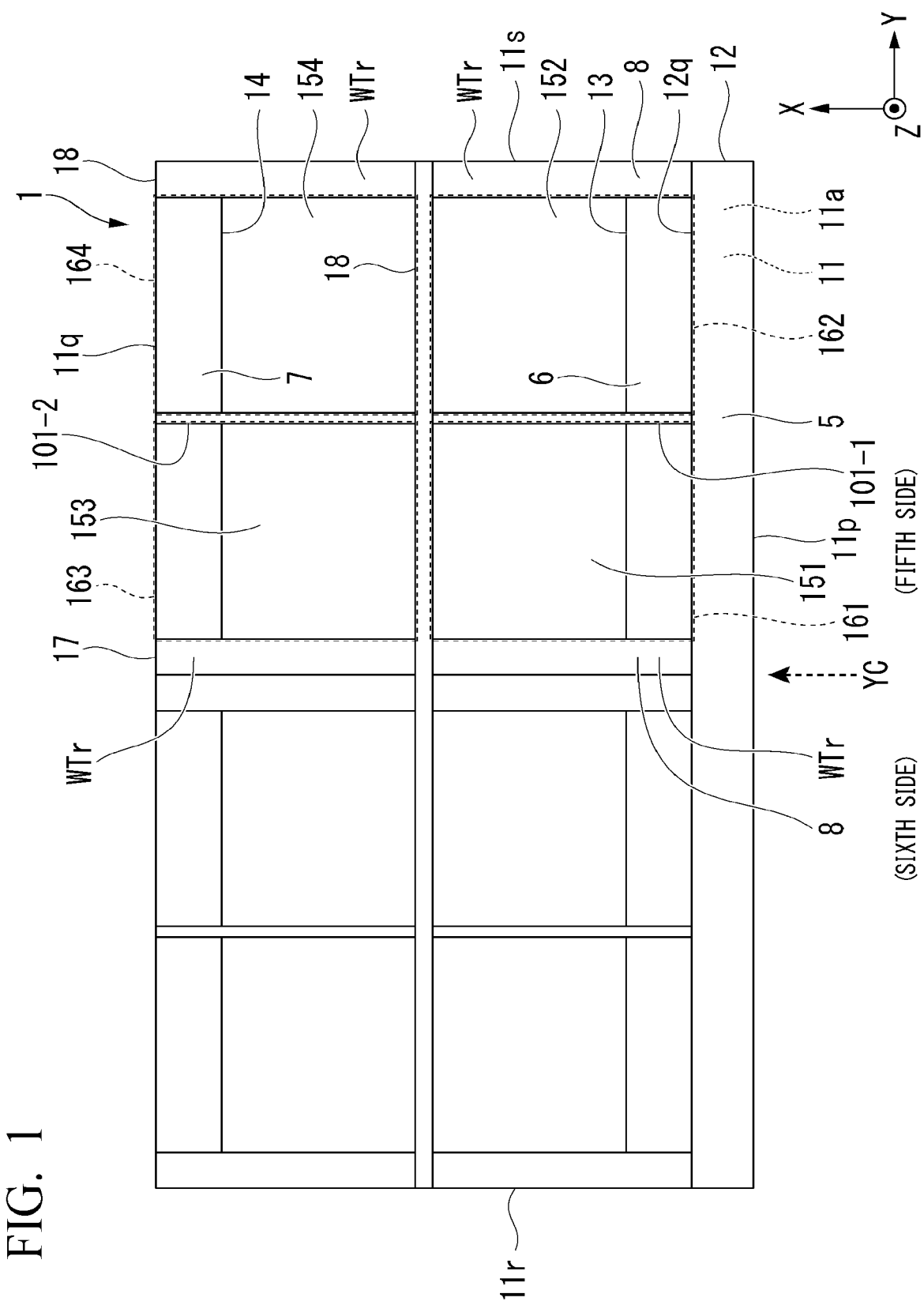
FIG. 1 is a plan view of a semiconductor memory device of a first embodiment.

According to some embodiments, a semiconductor memory device may include, but not limited to, a substrate, a first stack, a plurality of first pillars, a second stack, a plurality of second pillars and a third stack. The first stack includes a plurality of first conductive layers and a plurality of first insulating layers which are alternately stacked in a thickness direction of the substrate. The plurality of first conductive layers respectively have first side edges, which are different in position from each other in view of the thickness direction of the substrate, wherein the first side edge of a closer first conductive layer of the plurality of first conductive layers to the substrate is positioned outside the first side edge of a farther first conductive layer of the plurality of first conductive layers from the substrate. The plurality of first pillars extend inside the first stack in the thickness direction of the substrate. A first memory cell transistor is positioned at a crossing position between the first conductive layer and each of the plurality of first pillars. The second stack is positioned on the second side with respect to the first stack. The second stack includes a plurality of second conductive layers and a plurality of second insulating layers, which are alternately stacked in the thickness direction of the substrate. The second stack has the plurality of second conductive layers which respectively have second side edges, which are different in position from each other in view of the thickness direction of the substrate, wherein the second side edge of a closer second conductive layer of the plurality of second conductive layers to the substrate is positioned outside the second side edge of a farther second conductive layer of the plurality of second conductive layers from the substrate. The plurality of second pillars extend inside the second stack in the thickness direction of the substrate. A second memory cell transistor is positioned at a crossing position between the second conductive layer and each of the plurality of second pillars. The third stack is positioned between the first stack and the second stack in the first direction. The third stack includes a plurality of third insulating layers and a plurality of fourth insulating layers, which are different in material from each other, and which are alternately stacked in the thickness direction of the substrate.

Embodiments of a semiconductor memory device and a method of manufacturing a semiconductor memory device will hereinafter be described with reference to the accompanying drawings. In the following descriptions, components having the same function or similar functions are denoted by the same reference numerals and signs. Duplicate descriptions for components having the same function or similar functions may not omitted. In addition, the terms "parallel", "orthogonal", "same", and "equivalence" used herein in the disclosure include "substantially parallel", "substantially orthogonal", "substantially same", and "substantially equivalent".

The term "connection" used in the disclosure is not limited only to physical connection but also includes electrical connection. That is, the term "connection" is not limited only to a case where two elements are in direct contact with each other but also includes an indirect contact where another member is present between two elements. The term "contact" used herein in the present specification means direct contact. The terms "overlap", "face", and "adjacent" used in the disclosure are not limited only to a case where two elements directly face each other or a case where two elements are in direct contact with each other, but also include another case where two elements indirectly face each other or one or more elements are present between the two elements.

First Embodiment

Hereinafter, a configuration of a semiconductor memory device 1 of a first embodiment will be described. FIG. 1 is a plan view of the semiconductor memory device 1. As shown in FIG. 1, the semiconductor memory device 1 includes a silicon substrate (substrate) 11, a first stack 111, a plurality of first pillars 121, a second stack 131, a plurality of second pillars 141, and a third stack 171. The semiconductor memory device 1 includes a first peripheral circuit 5, a plurality of second peripheral circuits 6 and 7, and a plurality of row decoders 8 in addition to the above-described components.

The first peripheral circuit 5, the plurality of second peripheral circuits 6 and 7, and the plurality of row decoders 8 are formed on a surface 11a of the silicon substrate 11. In the following description, an X-direction (second direction) is a direction parallel to the surface 11a of the silicon substrate 11. The silicon substrate 11 has a rectangular shape when seen from a thickness direction. A Y-direction (first direction) is a direction along a long side of the silicon substrate 11. The Y-direction is a direction parallel to the surface 11a of the silicon substrate 11 and intersecting the X-direction. For example, the Y-direction is substantially orthogonal to the X-direction. The X-direction is a direction along a short side of the silicon substrate 11. A Z-direction is a thickness direction of the silicon substrate 11 and is a direction intersecting the X-direction and the Y-direction. For example, the Z-direction is substantially orthogonal to the X-direction and the Y-direction.

The first peripheral circuit 5 is a peripheral circuit of the semiconductor memory device 1 and is provided in a region 12 adjacent to a long side 11p of the silicon substrate 11 in the X-direction. The second peripheral circuit 6 is provided in a region 13. The region 13 is adjacent to a long side 12q of the region 12 in the X-direction and is provided on a fifth side of a center YC in the Y-direction. The second peripheral circuit 7 is provided in a region 14. The region 14 is adjacent to a long side 11q of the silicon substrate 11 in the X-direction and is provided on the fifth side of the center YC of the silicon substrate 11 in the Y-direction.

An insulating portion 18 is provided between the second peripheral circuits 6 and 7 in the X-direction. The insulating portion 18 is connected to each of short sides 11r and 11s of the silicon substrate 11 and extends in the Y-direction. The insulating portion 18 is formed of, for example, silicon oxide ($SiO_2$).

Sense amplifier portions 151 and 152 are provided between the second peripheral circuit 6 and the insulating portion 18 in the X-direction. The sense amplifier portions 151 and 152 are separated from each other by a third insulating portion 101-1 in the Y-direction. Sense amplifier portions 153 and 154 are provided between the second peripheral circuit 7 and the insulating portion 18 in the X-direction. The sense amplifier portions 153 and 154 are separated from each other by a third insulating portion 101-2 in the Y-direction.

A memory cell portion 161 is provided over the second peripheral circuit 6 adjacent to the sense amplifier portion 151 in the X direction and the sense amplifier portion 151. A memory cell portion 162 is provided over the second peripheral circuit 6 adjacent to the sense amplifier portion 152 in the X direction and the sense amplifier portion 152. A memory cell portion 163 is provided over the second peripheral circuit 7 adjacent to the sense amplifier portion 153 in the X direction and the sense amplifier portion 153. A memory cell portion 164 is provided over the second peripheral circuit 7 adjacent to the sense amplifier portion 154 in the X direction and the sense amplifier portion 154. In FIG. 1, the memory cell portions 161, 162, 163, and 164 are indicated by dashed lines.

A word line transistor WTr is provided in each of regions 17 adjacent to the sense amplifier portions 151 and each of regions 18 adjacent to the sense amplifier portions 152 in the Y-direction. The word line transistor WTr includes a plurality of row decoders 8. The same constituent elements as those on the fifth side are provided line-symmetrically with respect to the center YC on the surface 11a of the silicon substrate 11 on the sixth side from the center YC in the Y direction.

FIG. 1 shows an example of a layout of a main portion of the semiconductor memory device 1, and a layout of a main portion of the semiconductor memory device 1 may be appropriately changed. In addition, each of the sense amplifier portions 151, 152, 153, and 154 and each of the memory cell portions 161, 162, 163, and 164 may not overlap each other when seen from the Z-direction.

Figure 2:
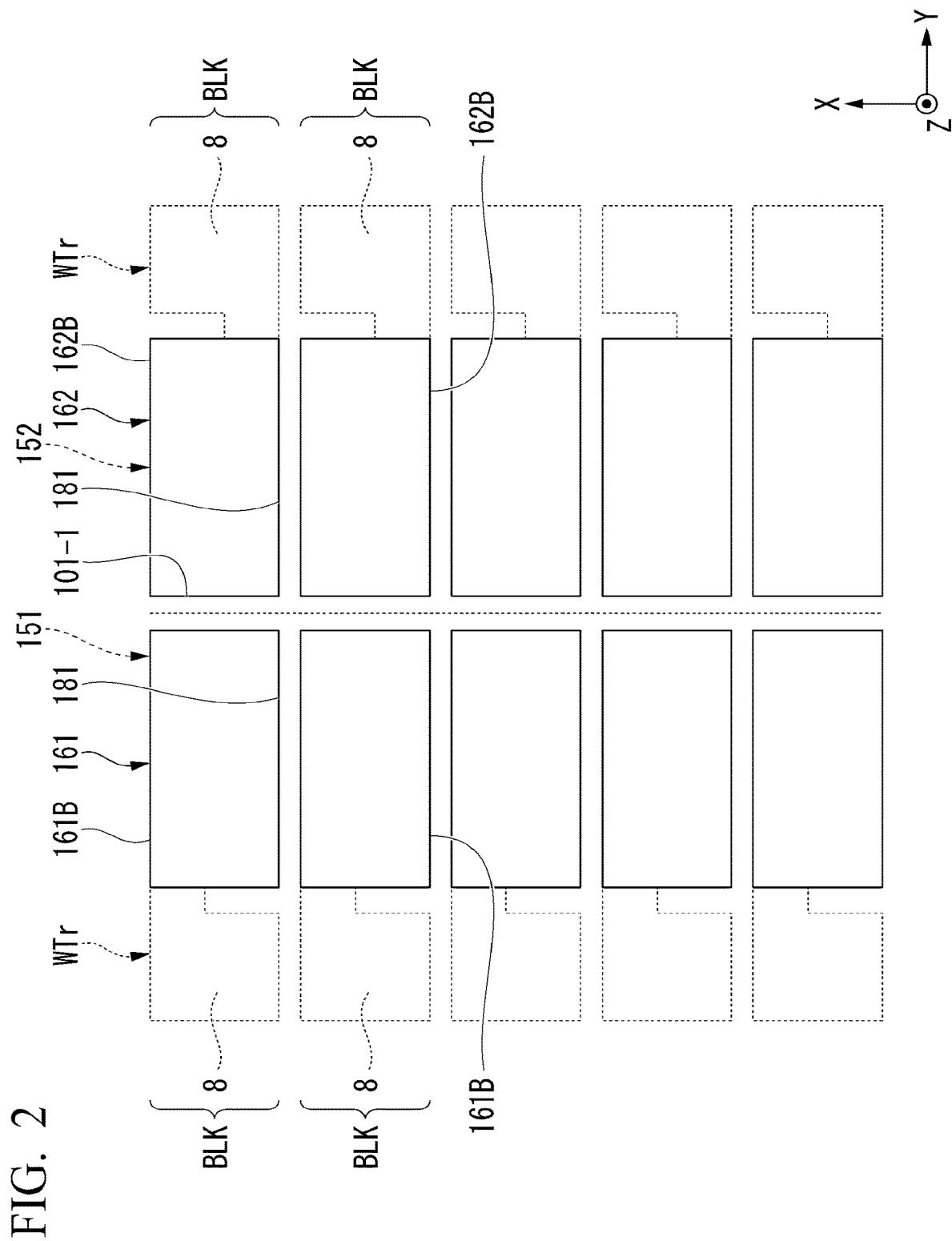
FIG. 2 is a schematic view showing of the semiconductor memory device of the first embodiment.

FIG. 2 is a schematic plan view showing a relative positional relationship between the memory cell portions 161 and 162, the word line transistor WTr, and the third insulating portion 101-1 of the semiconductor memory device 1. As shown in FIG. 2, in the word line transistor WTr, the plurality of row decoders 8 are lined up in the X-direction. The memory cell portions 161 and 162 are divided into a plurality of blocks BLK by a first slit 181 in the X-direction. The row decoders 8 of the word line transistor WTr are connected to a memory cell portion 161B of each BLK and a memory cell portion 162B of each BLK.

Figure 3:
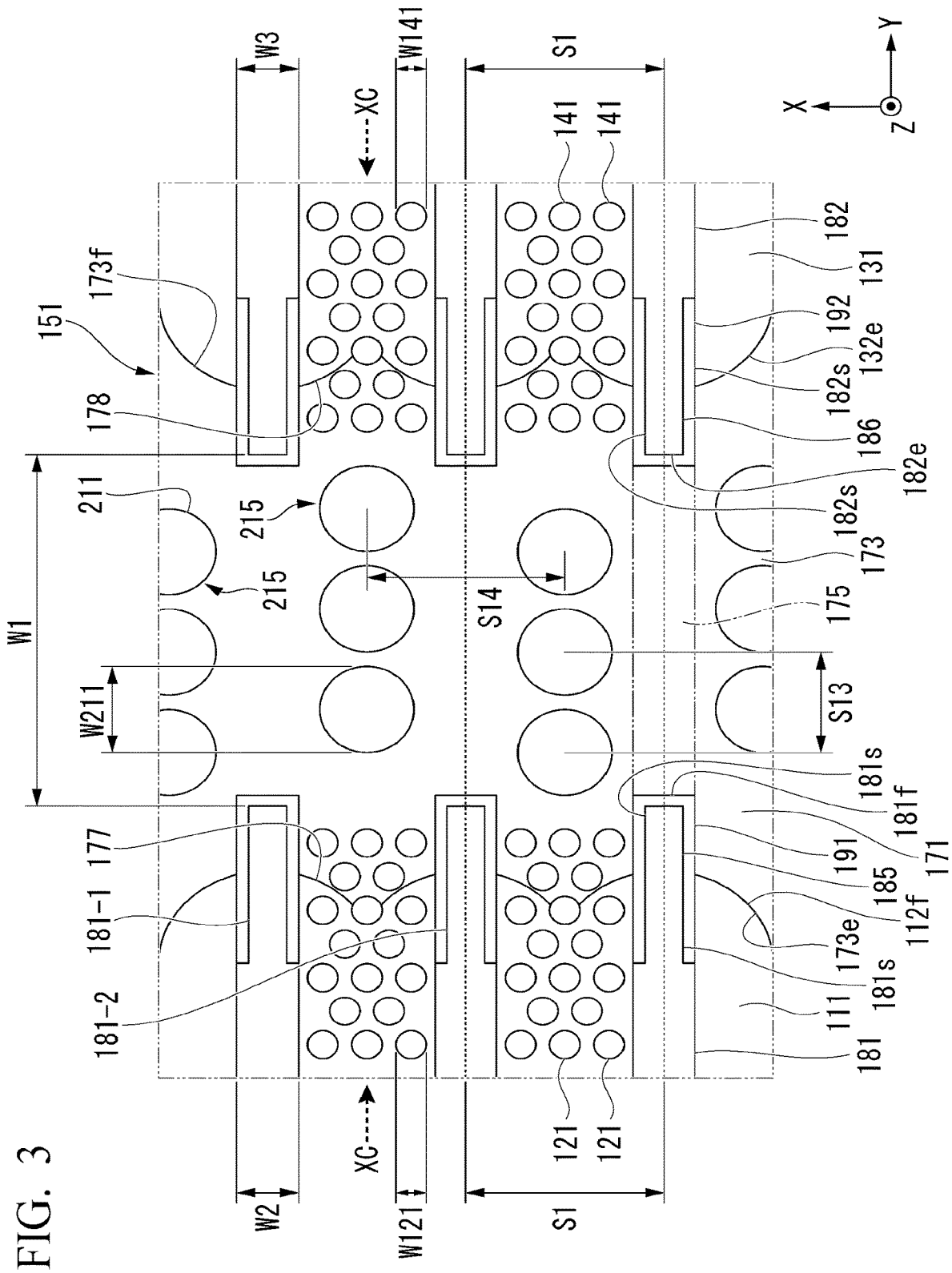
FIG. 3 is a plan view of a memory cells of the semiconductor memory device of the first embodiment.
Figure 4:
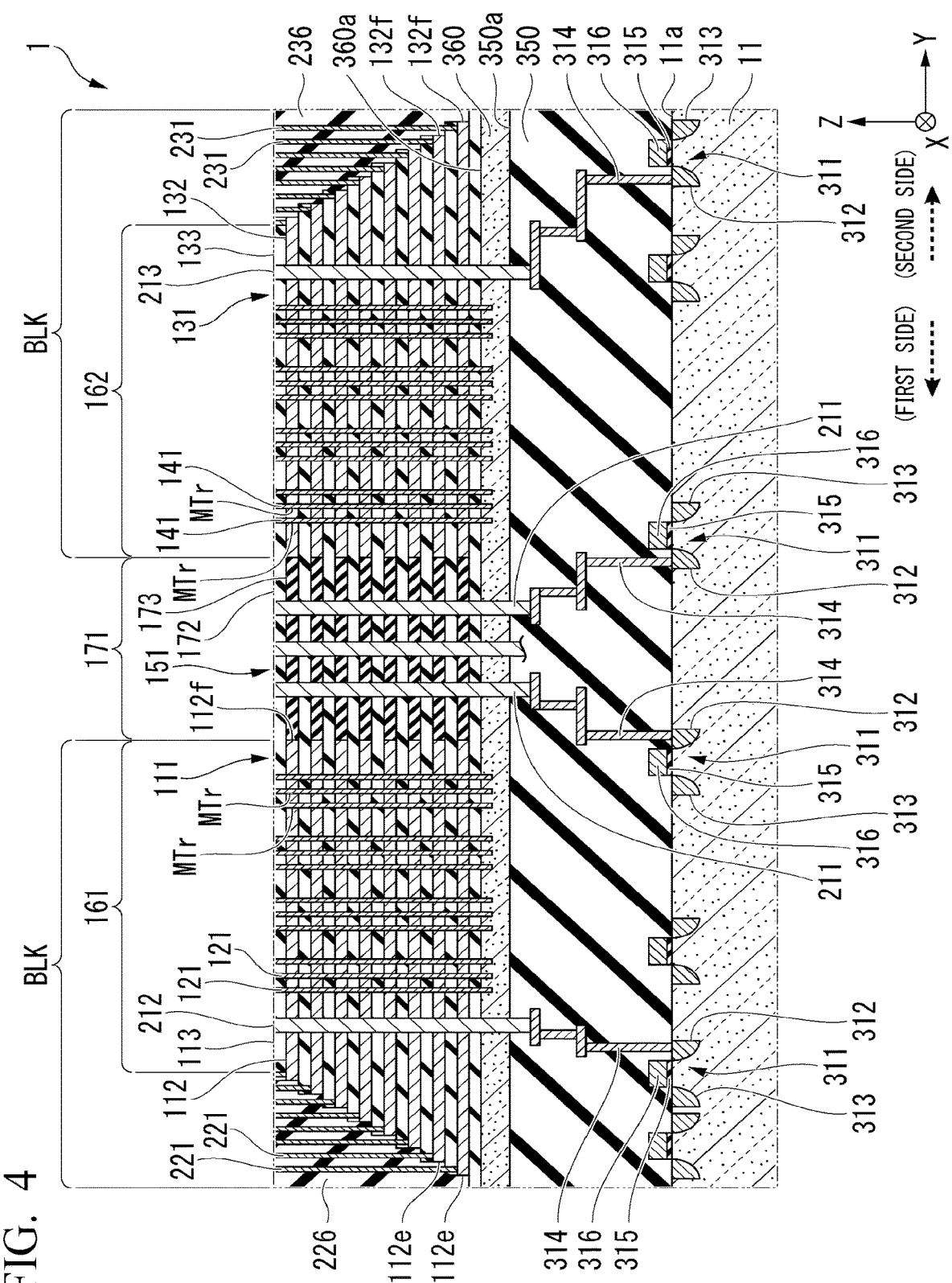
FIG. 4 is a cross-sectional view of the memory cells of the semiconductor memory device of the first embodiment.

FIG. 3 is a plan view of a main portion of the semiconductor memory device 1. FIG. 4 is a cross-sectional view seen from the X-direction of a main portion including the memory cell portions 161 and 162 and the third insulating portion 101-1 of the semiconductor memory device 1. In FIGS. 1 to 4, upper wires are omitted.

As shown in FIGS. 3 and 4, the memory cell portion 161 includes the first stack 111, the plurality of first pillars 121, the second stack 131, the plurality of second pillars 141, the third stack 171, the plurality of first slits 181, and at least one of third pillars 211, 212, and 213.

As shown FIG. 4, a plurality of metal-oxide-semiconductor field-effect transistors (MOSFET) 311 included in the second peripheral circuit 6 are provided on the surface 11a of the silicon substrate 11. An insulating interlayer 350 is provided on the silicon substrate 11. The insulating interlayer 350 is formed of, for example, silicon oxide. A semiconductor layer 360 is stacked on a surface 350a of the insulating interlayer 350 in the Z-direction. The semiconductor layer 360 functions as a bit line BL of the memory cell portion 161 and is formed of, for example, polysilicon. The first stack 111, the second stack 131, and the third stack 171 are stacked on a surface 360a of the semiconductor layer 360 in the Z-direction or the thickness direction of the substrate 11.

In the first stack 111, first conductive layers 112 and first insulating layers 113 are alternately stacked in the Z-direction or the thickness direction of the substrate 11. The first conductive layer 112 functions as a word line of the memory cell and may be formed of, for example, tungsten (W). The first insulating layer 113 may be formed of, for example, silicon oxide. As shown in FIG. 4, the first stack 111 includes the plurality of first conductive layers 112 and the plurality of first insulating layers 113, which are alternately stacked in a thickness direction of the substrate. The plurality of first conductive layers 112 have first side edges 112e which are different from each other in position in view of the Z-direction vertical to the surface 11a of the substrate 11 or the thickness direction of the substrate 11. The first side edge 112e of a closer layer of the plurality of first conductive layers 112 to the substrate 11 is positioned outside the first side edge 112e of a farther layer of the plurality of first conductive layers 112 from the substrate 11 in view of the Z-direction or the thickness direction of the substrate 11. The first side edge 112e of the first conductive layer 112 which is further away from the silicon substrate 11 in the Z-direction is positioned closer to a second side opposite to a first side in the Y-direction which is parallel to the surface 11a of the substrate 11. The first side edge 112e is positioned on the first side of the first conductive layers 112 in the Y-direction parallel to the surface 11a of the silicon substrate 11.

As shown in FIG. 4, each of the plurality of first pillars 121 extends in the Z-direction and inside the first stack 111. A memory cell transistor MTr is formed at a crossing position between each of the plurality of first pillars 121 and the first conductive layer 112. The edge of the first pillar 121 in the Z-direction which is closer to the silicon substrate 11 is positioned inside the semiconductor layer 360 in the Z-direction. The first pillar 121 may be formed of a semiconductor such as polysilicon. As shown in FIG. 3, each of the plurality of first pillars 121 may have, but is not limited to, a substantially circular cross-sectional shape in view of the Z-direction. The plurality of first pillars 121 are disposed at predetermined intervals in each of the X-direction and the Y-direction.

As shown in FIG. 4, the second stack 131 is positioned on the second side in the Y-direction with respect to the first stack 111. In the second stack 131, second conductive layers 132 and second insulating layers 133 are alternately stacked in the Z-direction. The second conductive layer 132 functions as a word line of the memory cell portion 161. The second conductive layer 132 may be formed of, for example, tungsten (W). The second insulating layer 133 may be formed of, for example, silicon oxide. As shown in FIG. 4, the second stack 131 includes the plurality of first conductive layers 132 and the plurality of first insulating layers 133, which are alternately stacked in a thickness direction of the substrate. The plurality of second conductive layers 132 have second side edges 132f which are different from each other in position in view of the Z-direction vertical to the surface 11a of the substrate 11 or the thickness direction of the substrate 11. The second side edge 132f of a closer layer of the plurality of second conductive layers 132 to the substrate 11 is positioned outside the second side edge 132f of a farther layer of the plurality of second conductive layers 132 from the substrate 11 in view of the Z-direction or the thickness direction of the substrate 11. The second side edge 132f of the second conductive layers 132 which is further away from the silicon substrate 11 in the Z-direction is positioned closer to the first side opposite to the second side in the Y-direction which is parallel to the surface 11a of the substrate 11. The second side edge 132f is positioned on the second side of the first conductive layers 112 in the Y-direction parallel to the surface 11a of the silicon substrate 11. Each of the plurality of second pillars 141 extends in the Z-direction inside the second stack 131. A memory cell transistor MTr is disposed at a crossing position between the second pillar 141 and the second conductive layer 132. The edge of the second pillar 141 in the Z-direction which is close to the silicon substrate 11 is positioned inside the semiconductor layer 360 in the Z-direction. The second pillar 141 may be formed of a semiconductor such as polysilicon. As shown in FIG. 3, each of the plurality of second pillars 141 has a substantially circular cross sectional shape in view of the Z-direction. The plurality of second pillars 141 may be disposed at predetermined intervals in each of the X-direction and the Y-direction.

As shown in FIG. 4, the third stack 171 is positioned between the first stack 111 and the second stack 131 in the Y-direction. In the third stack, third insulating layers 172 and fourth insulating layers 173 are alternately stacked in the Z-direction. As shown in FIGS. 3 and 4, the third insulating layer 172 is connected to the first insulating layer 113 and the second insulating layer 133. The fourth insulating layer 173 has the same planar shape as the first conductive layer 112 and the second conductive layer 132.

The third insulating layer 172 includes the same material as those of the first insulating layer 113 and the second insulating layer 133. The third insulating layer 172 may be formed of, for example, silicon oxide. The fourth insulating layer 173 includes a material different from that of the third insulating layer 172. The fourth insulating layer 173 may be formed of, for example, silicon nitride.

As shown in FIG. 3, the plurality of first slits 181 are positioned at first intervals S1 in the X-direction inside the first stack 111. Each of the plurality of first slits 181 extends vertically from the surface 11a of the silicon substrate 11. A plurality of second slits 182 are positioned at first intervals S1 in the X-direction inside the second stack 131. Each of the plurality of second slits 182 extends vertically from the surface 11a of the silicon substrate 11. Each of the plurality of first slits 181 is positioned at the same position as one of the plurality of second slits 182 in the X-direction. As shown in FIGS. 3 and 4, the third stack 171 includes an insulating portion (portion) 175 between the plurality of first slits 181 and the plurality of second slits 182 in the Y-direction. Each of the first slit 181 and the second slit 182 may include a conductive material such as tungsten.

At least one first slit 181 included in the plurality of first slits 181 includes an extending portion 185 which extends further to the second side than an edge 112f of the first conductive layer 112 on the second side in the Y-direction and positioned inside the third stack 171. A first film 191 is provided in at least one first slit 181. The first film 191 is provided on an edge face 181f of each of at least one first slit 181 on the second side in the Y-direction and provided in a partial region of a side surface 181s connected to the edge face 181f. A portion (part) of the first film 191 on the first side in the Y-direction extends further to the first side than an edge 173e of the fourth insulating layer 173 on the first side and positioned inside the first stack 111.

At least one second slit 182 included in the plurality of second slits 182 includes an extending portion 186 which extends further to the first side than an edge 132e of the second conductive layer 132 on the first side in the Y-direction and positioned inside the third stack 171. A second film 192 is provided in at least one second slit 182. The second film 192 is provided on an edge face 182e of each of at least one second slit 182 on the first side in the Y-direction and in a partial region of the side surface 182s connected to the edge face 182e. A portion (part) of the second film 192 on the second side in the Y-direction extends further to the second side than an edge 173f of the fourth insulating layer 173 on the second side and is positioned inside the second stack 131.

As shown in FIG. 3, a minimum width W1 of the third stack 171 in the Y-direction is larger than a maximum width W2 of one first slit 181 included in the plurality of first slits 181 in the X-direction. The minimum width W1 of the third stack 171 in the Y-direction is larger than a maximum width W3 of one second slit 182 included in the plurality of second slits 182 in the X-direction.

The edge 173e of the fourth insulating layer 173 on the first side includes an inclined portion 177 in a cross-section parallel to the surface 11a of the silicon substrate 11. The inclined portion 177 is inclined toward the first side as the position is closer to an intermediate position XC between two first slits 181-1 and 181-2 in the X-direction from any one of the two first slits 181-1 and 181-2 included in the plurality of first slits 181 and adjacent to each other in the X-direction. Similarly, in a cross-section parallel to the surface 11a of the silicon substrate 11, the edge 173f of the fourth insulating layer 173 on the second side includes an inclined portion 178. The inclined portion 178 is inclined toward the second side as the position is closer to an intermediate position XC between two second slits 182-1 and 182-2 in the X-direction from any one of the two second slits 182-1 and 182-2 included in the plurality of second slits 182 and adjacent to each other in the X-direction. Each of the inclined portions 177 and 178 is curved so as to form an arc in view of the Z-direction.

Materials of the first film 191 and the second film 192 are more resistant to at least one type of etchant capable of removing the fourth insulating layer 173 than the fourth insulating layer 173. Each of the first film 191 and the second film 192 may include one or more of, for example, silicon oxide, polysilicon, amorphous silicon, and boron nitride.

As shown in FIGS. 3 and 4, the third pillar 211 extends in the Z-direction inside the third stack 171 and is electrically connected to the silicon substrate 11. However, the third pillar 211 may not be electrically connected to the silicon substrate 11, and may be connected to, for example, a gate electrode of the memory cell transistor MTr or may be in an electrically floating state.

More specifically, the MOSFET 311 includes semiconductor portions 312 and 313, a conductive portion 314, and an insulating film 315. The silicon substrate 11 is formed of a P-type semiconductor. For this reason, the semiconductor portions 312 and 313 are both formed of an N-type semiconductor and are formed by ion-implanting impurities into internal regions spaced apart from each other in the Y-direction on the surface 11a side of the silicon substrate 11. The conductive portion 314 is provided on the surface 11a of the silicon substrate 11 between the semiconductor portions 312 and 313 in the Y-direction. The conductive portion 314 is formed of, for example, a high-K metal gate (HKMG) material. The insulating film 315 is provided between the silicon substrate 11 and the conductive portion 314 in the Z-direction. The insulating film 315 is formed of, for example, silicon oxide. A conductive portion 316 is connected to the semiconductor portion 312. The conductive portion 316 extends toward the third pillar 211 in the Z-direction and the Y-direction. The conductive portion 316 and the semiconductor portion 312 function as sources of the MOSFET 311. The conductive portion 314 functions as a gate of the MOSFET 311. The semiconductor 313 which is not connected to the conductive portion 316 functions as a drain of the MOSFET 311. The third pillar 211 is connected to the semiconductor portion 312 through the conductive portion 314.

The memory cell portion 161 includes at least three third pillars 211. As shown in FIG. 3, three third pillars 211 are lined up at third intervals S13 in the Y-direction. The three third pillars 211 overlapping each other in the X-direction and lined up at intervals in the Y-direction are defined as pillars 215 of a first group. The memory cell portion 161 includes pillars 215 of a plurality of first groups. The pillars 215 of the first group are disposed at a substantially intermediate position between two first slits 181 adjacent to each other in the X-direction and at a substantially intermediate position between two second slits 182 adjacent to each other in the X-direction. That is, the pillars 215 of the first group are lined up at fourth intervals S14 in the X-direction. The fourth interval S14 is substantially equal to the first interval S1. Pillars 215 of another first group which are adjacent to each other in the X-direction with respect to pillars 215 of one first group are shifted on a first side or a second side in the Y-direction. In a case where there are pillars 215 of two first groups which are adjacent to each other on both sides in the X-direction with respect to pillars 215 of one first group, the pillars 215 of the two first groups are shifted on the same side of the first side or the second side in the Y-direction with respect to the pillars 215 of one first group.

As shown in FIG. 4, the third pillar 212 further extends in the Z-direction inside the first stack 111 on the first side in the Y-direction than the plurality of first pillars 121 and is electrically connected to the silicon substrate 11. The third pillar 213 further extends in the Z-direction inside the second stack 131 on the second side in the Y-direction than the plurality of second pillars 141. Each of the third pillars 211, 212, and 213 penetrates the semiconductor layer 360 in the Z-direction. The edge of each of the third pillars 211, 212, and 213 in the Z-direction which is close to the silicon substrate 11 is positioned inside the periphery of the semiconductor layer 360 in the Z-direction.

Each of the third pillars 211, 212, and 213 is electrically connected to the silicon substrate 11. Each of the third pillars 212 and 213 is connected to the semiconductor portion 312 of the MOSFET 311 through the conductive portion 314.

A width W211 of the third pillar 211 in the Y-direction and the width of each of the third pillars 212 and 213 in the Y-direction are larger than a width W121 of the first pillar 121 in the Y-direction and a width W141 of the second pillar 141 in the Y-direction. In other words, the width W121 of the first pillar 121 in the Y-direction and the width W141 of the second pillar 141 in the Y-direction are smaller than the width W211 of the third pillar 211 in the Y-direction. Each of the third pillars 211, 212, and 213 is formed of, for example, tungsten.

The semiconductor memory device 1 includes the same number of plurality of fourth pillars 221 as the number of first conductive layers 112. The plurality of fourth pillars 221 are connected to portions close to the edges 112e of the plurality of first conductive layers 112 on the first side in the Y-direction. The fourth pillar 221 positioned on a side closest to the first side in the Y-direction among the plurality of fourth pillars 221 is connected to a portion which is close to the first side edge 112e of the first conductive layer 112 closest to the silicon substrate 11 in the Z-direction among the plurality of first conductive layers 112 and which does not overlap the first conductive layer 112 in the Y-direction adjacent thereto on a side opposite to the silicon substrate 11 in the Z-direction. The fourth pillar 221 positioned on a side closest to the second side in the Y-direction among the plurality of fourth pillars 221 is connected to a portion which is close to the first side edge 112e of the first conductive layer 112 farthest from the silicon substrate 11 in the Z-direction among the plurality of first conductive layers 112. The width of the fourth pillar 221 in the Y-direction is smaller than the width W211 of the third pillar 211 in the Y-direction.

The semiconductor memory device 1 includes the same number of plurality of fifth pillars 231 as the number of second conductive layers 132. The plurality of fifth pillars 231 are connected to portions close to the edges 132f of the plurality of second conductive layers 132 on the second side in the Y-direction. The fifth pillar 231 positioned on a side closest to the second side in the Y-direction among the plurality of fifth pillars 231 is connected to a portion which is close to the edge 132f of the second conductive layer 132 closest to the silicon substrate 11 in the Z-direction among the plurality of second conductive layers 132 and which does not overlap the second conductive layer 132 in the Y-direction adjacent thereto on a side opposite to the silicon substrate 11 in the Z-direction. The fifth pillar 231 positioned on a side closest to the first side in the Y-direction among the plurality of fifth pillars 231 is connected to a portion which is close to the edge 132f of the second conductive layer 132 farthest from the silicon substrate 11 in the Z-direction among the plurality of second conductive layers 132. The width of the fifth pillar 231 in the Y-direction is smaller than the width W211 of the third pillar 211 in the Y-direction. The fourth pillar 221 and the fifth pillar 231 are formed of, for example, tungsten.

Each of the plurality of fourth pillars 221 is adjacent to the insulating interlayer 226 in the Y-direction. Each of the plurality of fifth pillars 231 is adjacent to the insulating interlayer 236 in the Y-direction. Each of the insulating interlayers 226 and 236 is formed of, for example, silicon oxide.

Subsequently, a method of manufacturing a main portion of the semiconductor memory device 1 of the first embodiment will be briefly described. The method of manufacturing a main portion of the semiconductor memory device 1 includes forming a stack (intermediate stack) 400 by alternately laminating an insulating layer (first insulating film) 401 and an insulating layer (second insulating film) 402 formed of a material different from that of the insulating layer 401 in a thickness direction of a substrate. The stack 400 includes a first region, a second region, and a third region positioned between the first region and the second region. The method of manufacturing a main portion of the semiconductor memory device 1 includes forming a plurality of grooves (first grooves) 411 in the first region of the stack 400 and forming a plurality of grooves (second grooves) 412 in the second region of the stack 400. The method of manufacturing a main portion of the semiconductor memory device 1 includes forming an insulating film (protection film) 451 on the inner surfaces of the plurality of grooves 411 and the inner surfaces of the plurality of grooves 412. The method of manufacturing a main portion of the semiconductor memory device 1 includes forming a resist film (resist) 460 that covers the third region of the stack 400, a portion of each of the plurality of grooves 411 adjacent to the third region, and a portion of each of the plurality of grooves 412 adjacent to the third region, and removing a portion of the insulating film 451 positioned in a region which is not covered with the resist film 460. The method of manufacturing a main portion of the semiconductor memory device 1 includes partially removing the insulating layer 401 through a region from which the insulating film 451 is removed by supplying an etchant to the plurality of grooves 411 and the plurality of grooves 412, and supplying a conductive material to a region from which the insulating layer 401 is removed.

The drawings of FIGS. 5 to 11 are plan views and cross-sectional views showing an example of a manufacturing process for the main portion. Upper drawings in FIGS. 5 to 11 are plan view of components in the respective manufacturing processes in view of the Z-direction. Lower drawings in FIGS. 4 to 15 are cross-sectional views of components in the respective manufacturing processes in view of the X-direction and cross-sectional views taken along dashed lines shown in the upper drawings.

Although not shown in the drawing, a plurality of MOSFETs 311 are formed on the surface 11a of the silicon substrate 11. The insulating interlayer 350 is stacked on the exposed surface 11a and the plurality of MOSFETs 311. In this case, the conductive portion 314 is formed while laminating the insulating interlayer 350 a plurality of times in Z-direction.

Figure 5:
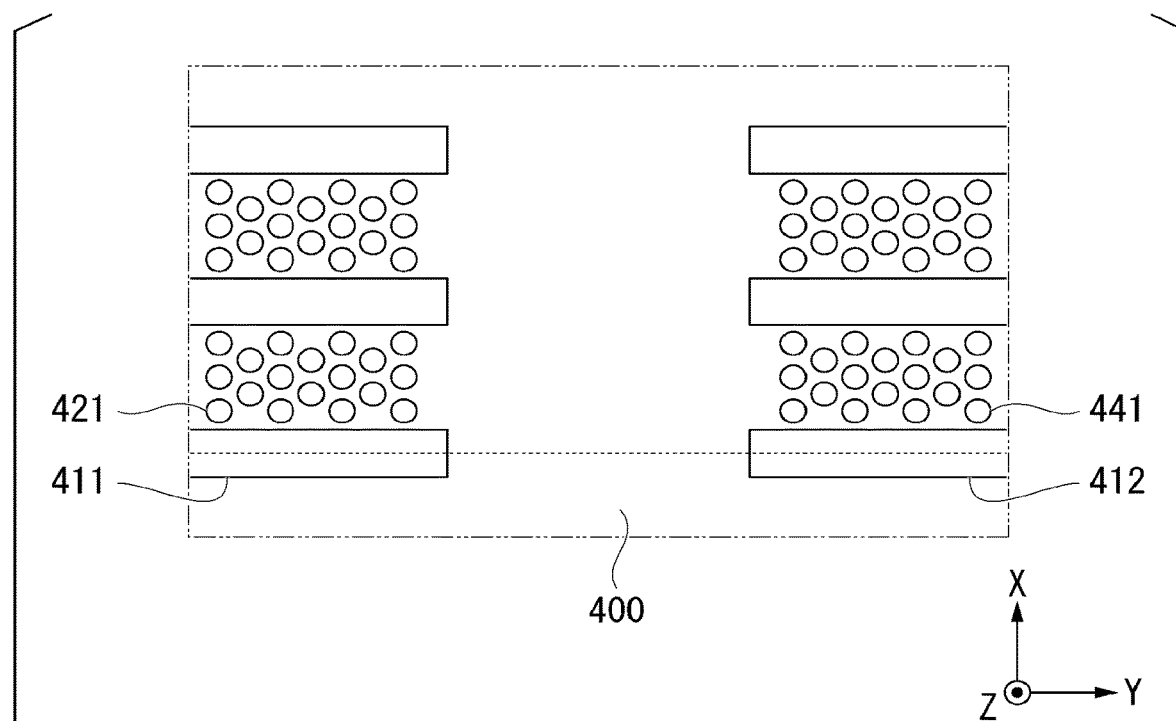
FIG. 5 is a plan view and a cross-sectional view showing a step involved in a manufacturing process for the memory cells of the semiconductor memory device of the first embodiment.
Figure 5:
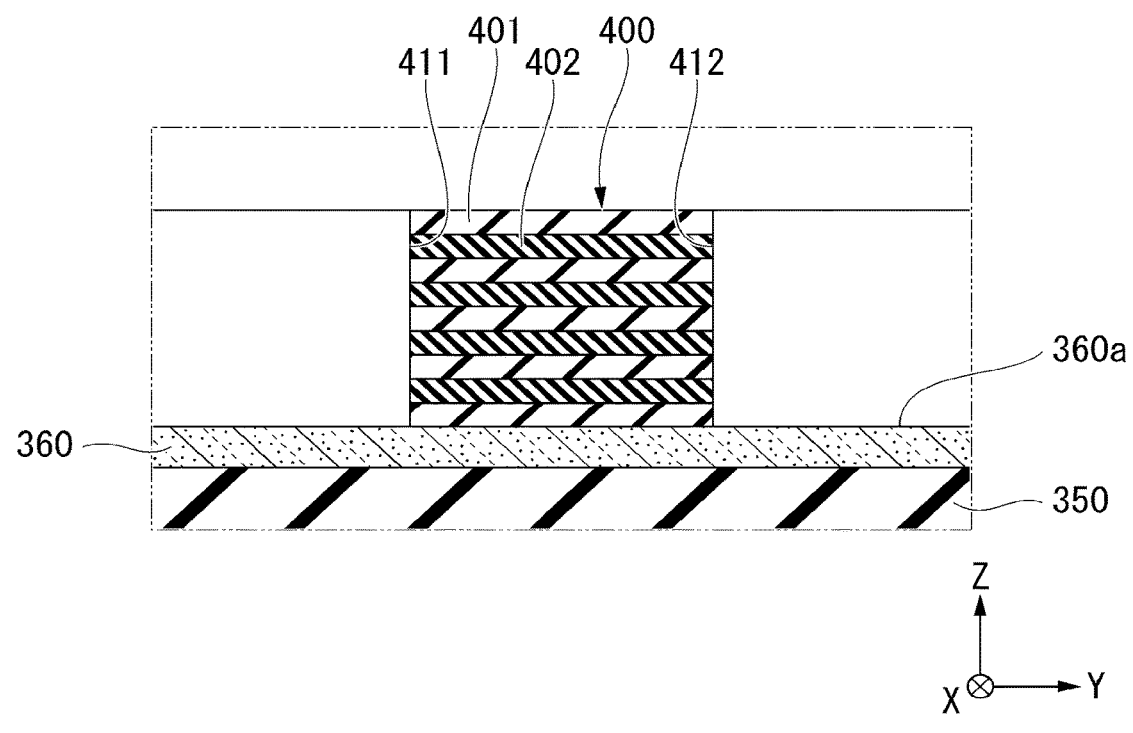

As shown in FIG. 5, the insulating interlayer 350 is stacked in the Z-direction, and a stack 400 is formed on the surface 350a of the insulating interlayer 350. In the lower drawing of FIG. 5, components on a side opposite to the silicon substrate 11 in the Z-direction of the insulating interlayer 350 are shown. The stack 400 is formed by alternately laminating insulating layers 401 and 402 formed of different materials in the Z-direction. The material of the insulating layer 401 is the same as that of the third insulating layer 172 and is, for example, silicon oxide. The material of the insulating layer 402 is the same as that of the fourth insulating layer 173 and is, for example, silicon nitride.

Subsequently, a plurality of grooves 411 and 412 are formed in the stack 400. The positions of the plurality of grooves 411 in the X-direction and the Y-direction are the same as the positions of the plurality of first slits 181 of the semiconductor memory device 1. The positions of the plurality of grooves 412 in the X-direction and the Y-direction are the same as the positions of the plurality of second slits 182 of the semiconductor memory device 1. The plurality of grooves 411 and 412 are dug in a direction opposite to the Z-direction inside the stack 400 and stopped inside the semiconductor layer 360 in the Z-direction. A plurality of holes 421 are formed in the stack 400 adjacent to the groove 411 in the X-direction. The positions of the plurality of holes 421 in the X-direction and the Y-direction are the same as the positions of the plurality of first pillars 121 of the semiconductor memory device 1. A plurality of holes 441 are formed in the stack 400 adjacent to the groove 412 in the X-direction. The positions of the plurality of holes 441 in the X-direction and the Y-direction are the same as the positions of the plurality of second pillars 141 of the semiconductor memory device 1.

Figure 6:
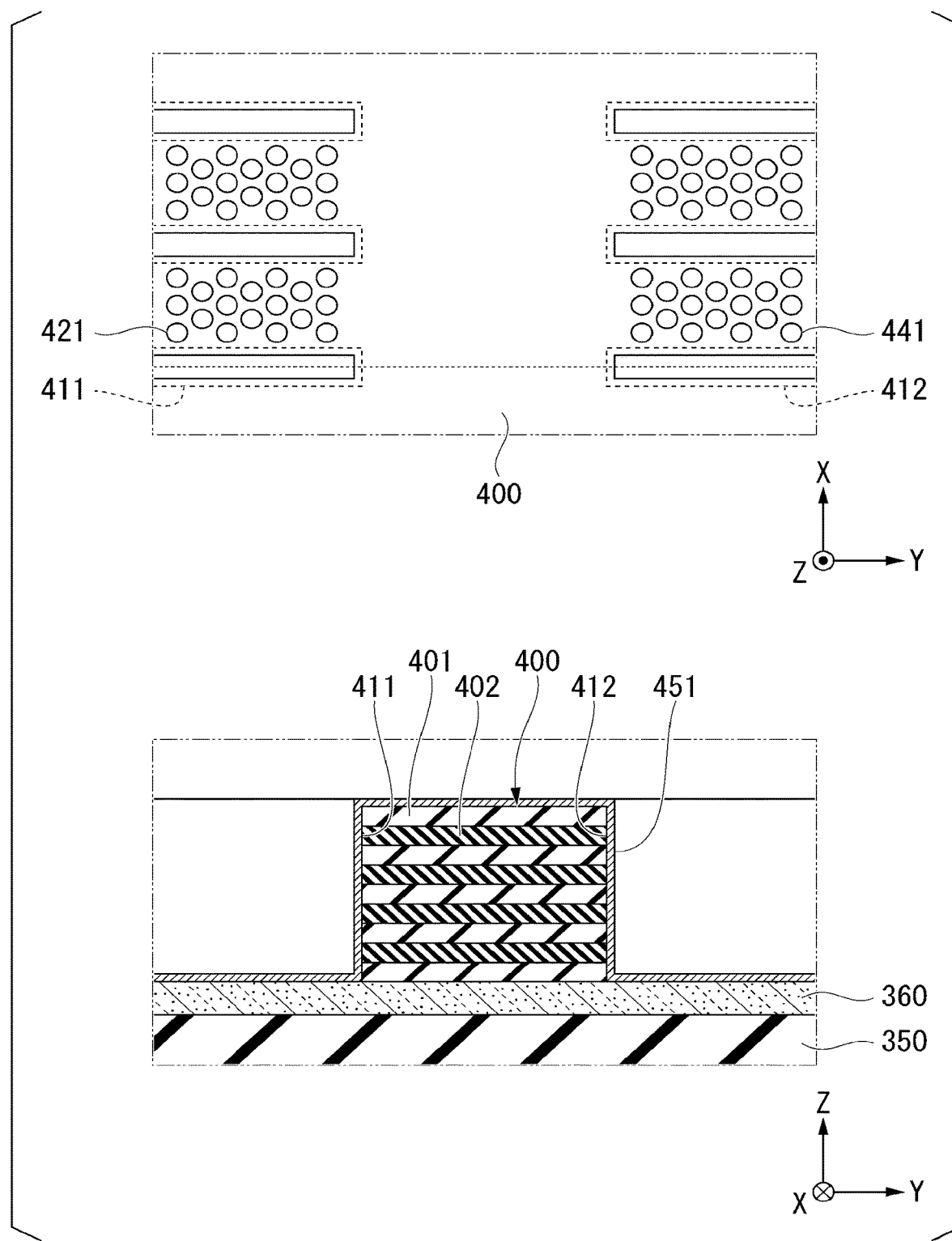
FIG. 6 is a plan view and a cross-sectional view showing a step involved in a manufacturing process for the memory cells of the semiconductor memory device of the first embodiment.

As shown in FIG. 6, the insulating film 451 is formed on the inner walls of the grooves 411 and 412 and the surface of the stack 400. The insulating film 451 includes materials of the first film 191 and the second film 192 and includes the same material as that of the insulating layer 401. The material of the insulating film 451 has higher resistance than that of the insulating layer 402 with respect to at least one type of etchant capable of removing the material of the insulating layer 402. The insulating film 451 includes one or more of, for example, silicon oxide, polysilicon, amorphous silicon, and boron nitride.

Figure 7:
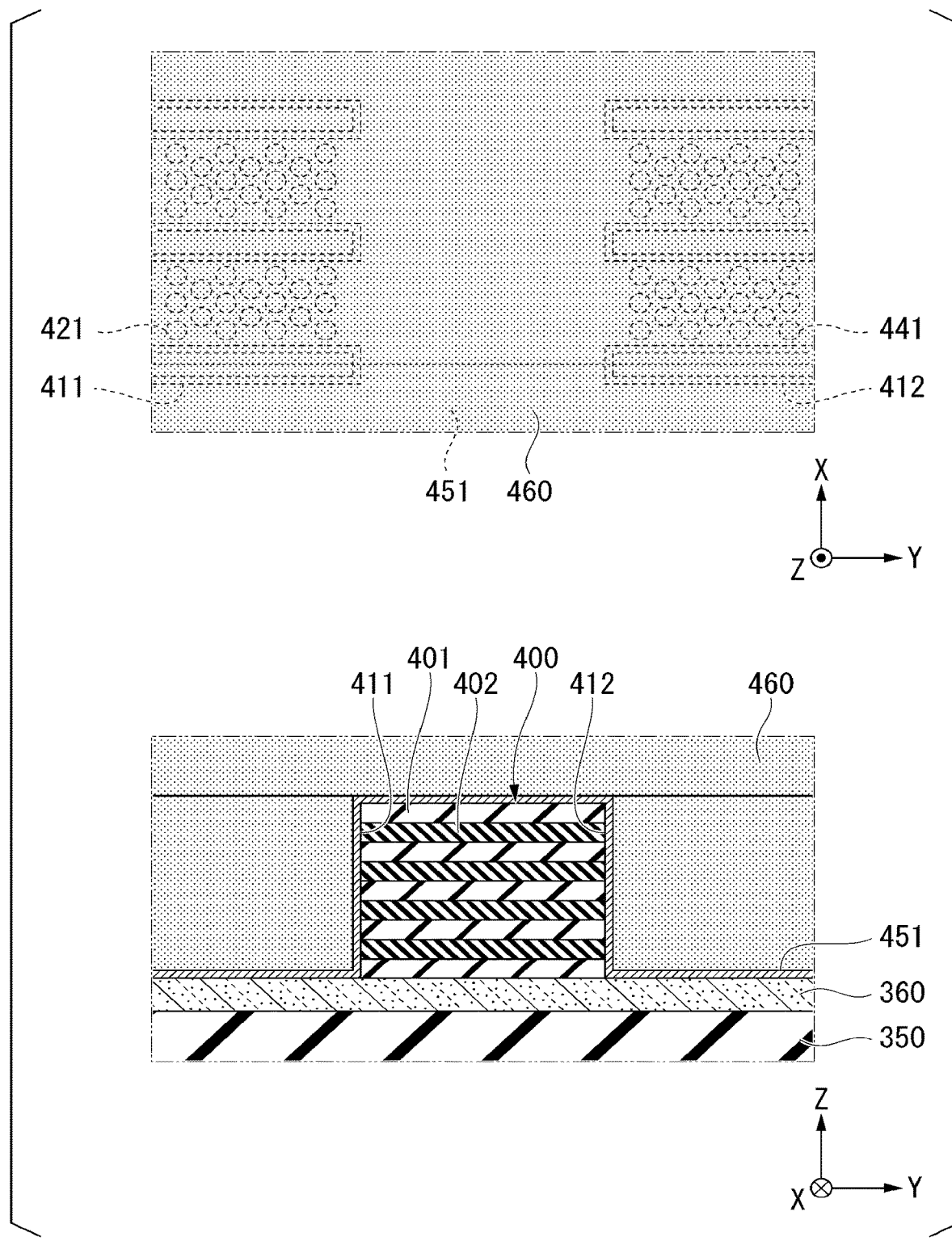
FIG. 7 is a plan view and a cross-sectional view showing a step involved in a manufacturing process for the memory cells of the semiconductor memory device of the first embodiment.
Figure 8:
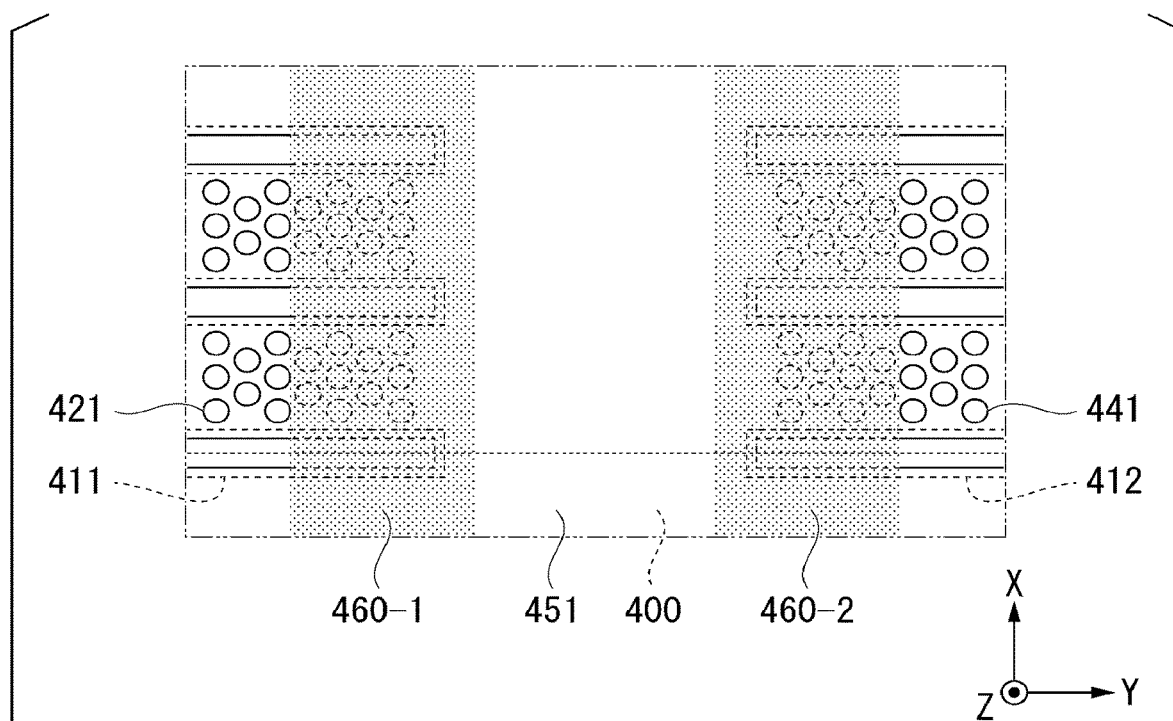
FIG. 8 is a plan view and a cross-sectional view showing a step involved in a manufacturing process for the memory cells of the semiconductor memory device of the first embodiment.
Figure 8:
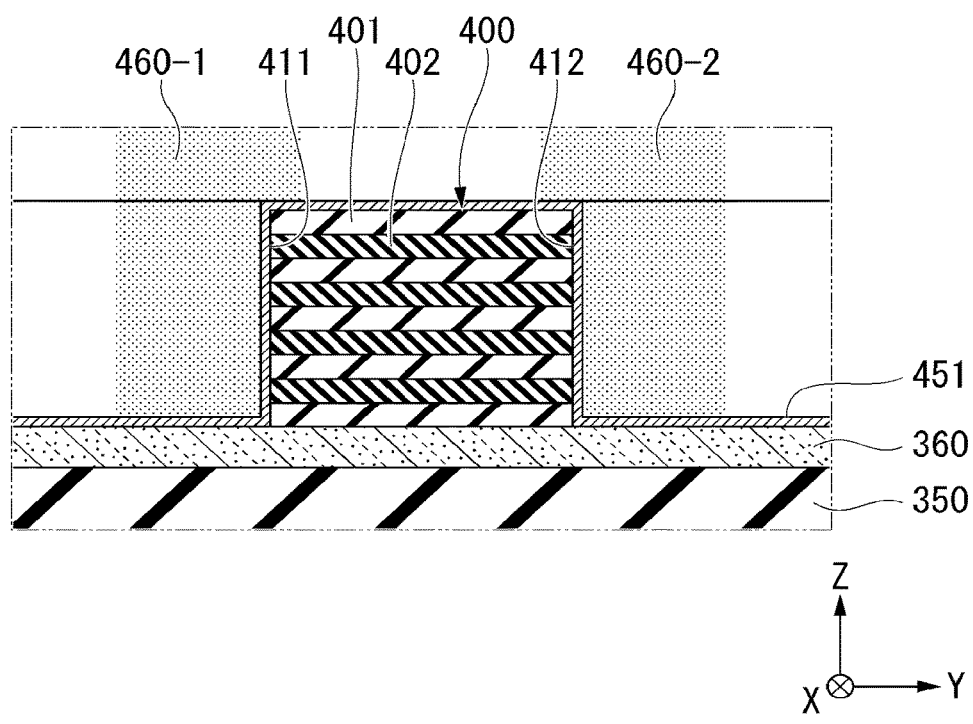

As shown in FIG. 7, the resist film 460 is applied so as to cover the insulating film 451. As shown in FIG. 8, the resist film 460 in a region where the first film 191 and the second film 192 are to be formed in the Y-direction is left, and the resist films 460 in the other regions are removed by, for example, patterning.

Figure 9:
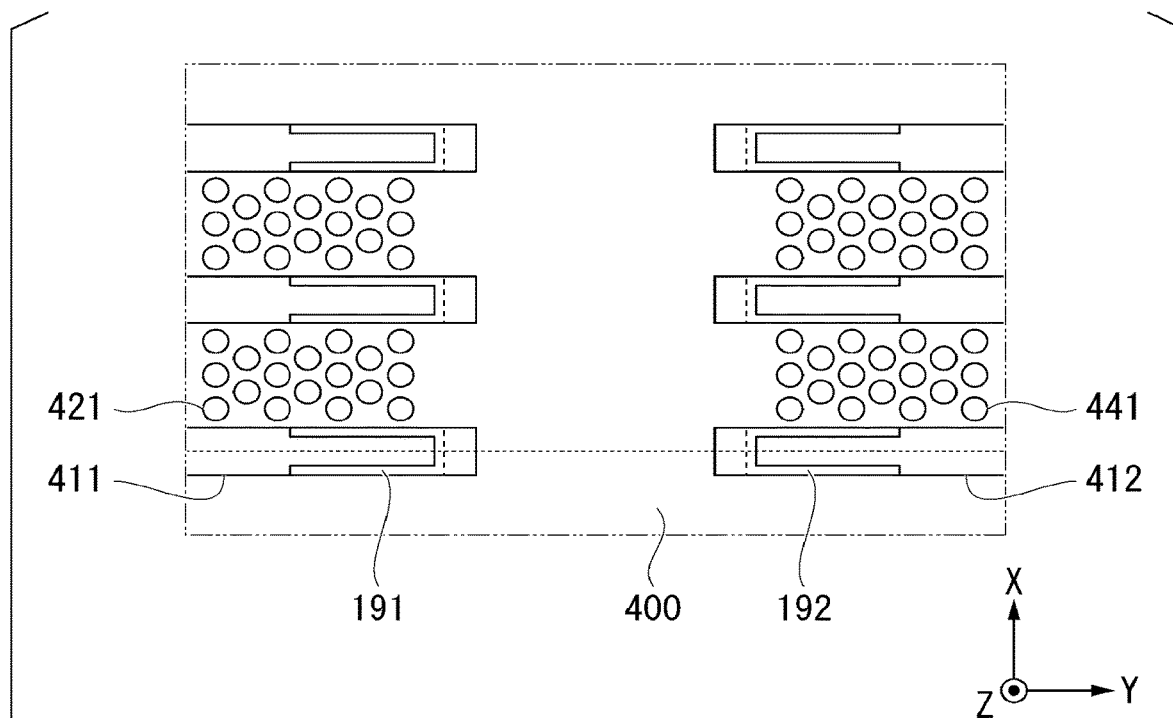
FIG. 9 is a plan view and a cross-sectional view showing a step involved in a manufacturing process for the memory cells of the semiconductor memory device of the first embodiment.
Figure 9:
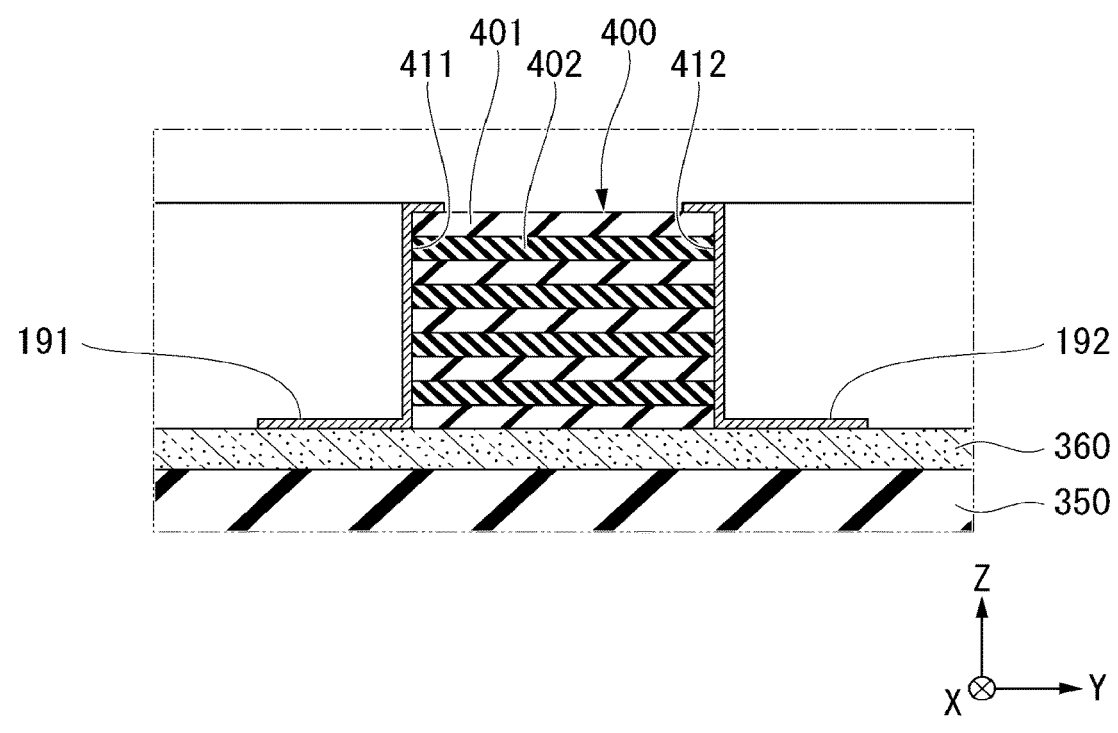

As shown in FIG. 9, the insulating film 451 which is not covered with each of resist films 460-1 and 460-2 is removed by, for example, etching using each of the resist films 460-1 and 460-2 as a mask. Thereafter, the first film 191 and the second film 192 are formed by removing the resist films 460-1 and 460-2.

Figure 10:
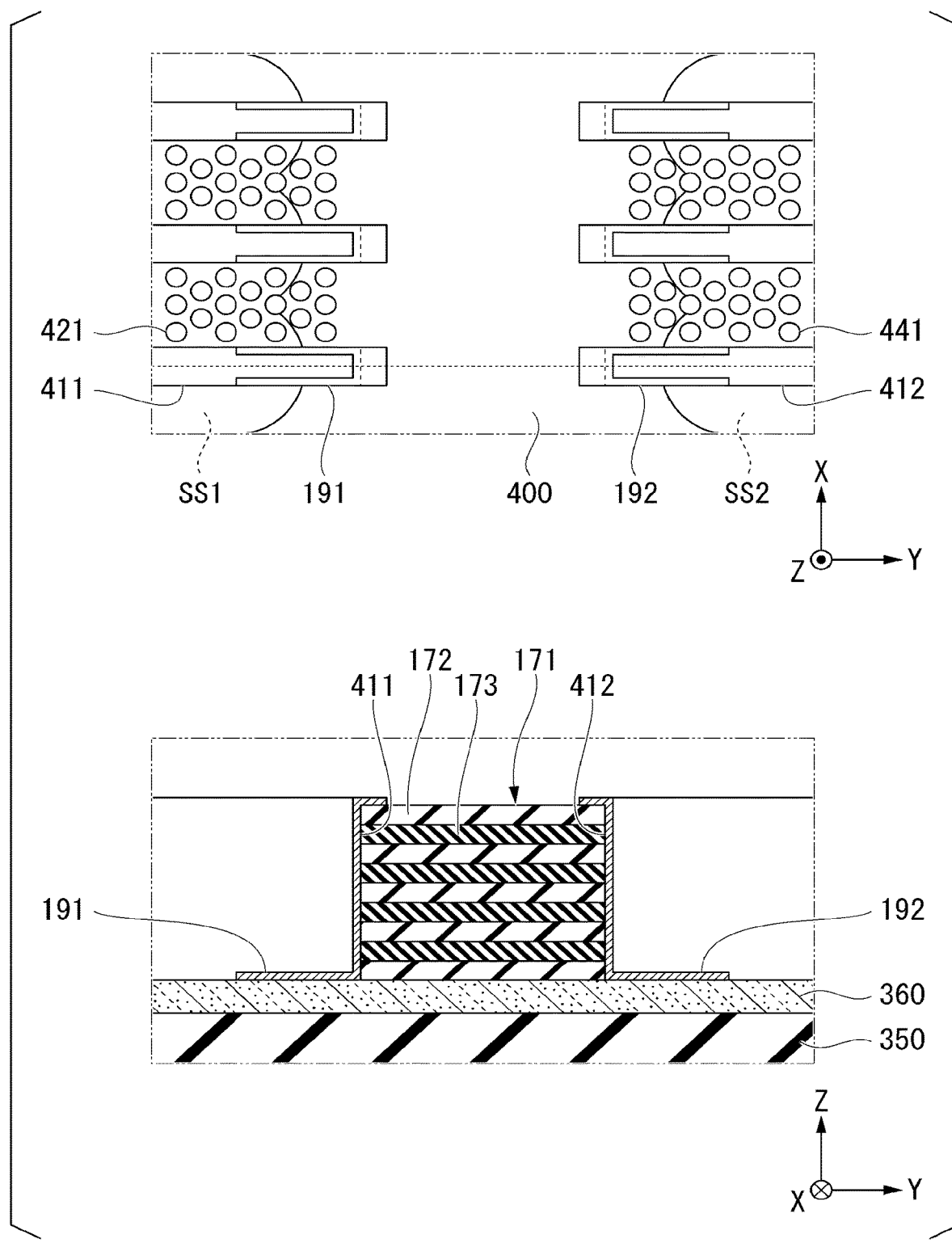
FIG. 10 is a plan view and a cross-sectional view showing a step involved in a manufacturing process for the memory cells of the semiconductor memory device of the first embodiment.

Subsequently, the insulating layer 402 is removed from an edge of the insulating layer 402 on the first side in the Y-direction toward the second side in the Y-direction, that is, toward the central portion in the stack 400 by using, for example, etching, a medicinal fluid, or the like. The insulating layer 402 is removed from an edge of the insulating layer 402 on the second side in the Y-direction toward the first side, that is, toward the central portion at the same time as the removal of the insulating layer 402 from the first side or after the removal of the insulating layer 402 from the first side. A processing time of the insulating layer 402 using etching, a medicinal fluid, or the like is adjusted so that the edge of the insulating layer 402 on the first side in the Y-direction intersects the first film 191 on the side surface when seen from the Y-direction of the groove 411 and the edge of the insulating layer 402 on the second side in the Y-direction intersects the second film 192 on the side surface when seen from the Y-direction of the groove 412. After processing, the third stack 171 including portions positioned between the plurality of grooves 411 and the plurality of grooves 412 in the Y-direction is formed as shown in FIG. 10. A plurality of gaps SS1 adjacent to a plurality of insulating layers 401 in the Z-direction are formed on the first side of the third stack 171 in the Y-direction. A plurality of gaps SS2 adjacent to the plurality of insulating layers 401 in the Z-direction are formed on the second side of the third stack 171 in the Y-direction.

Figure 11:
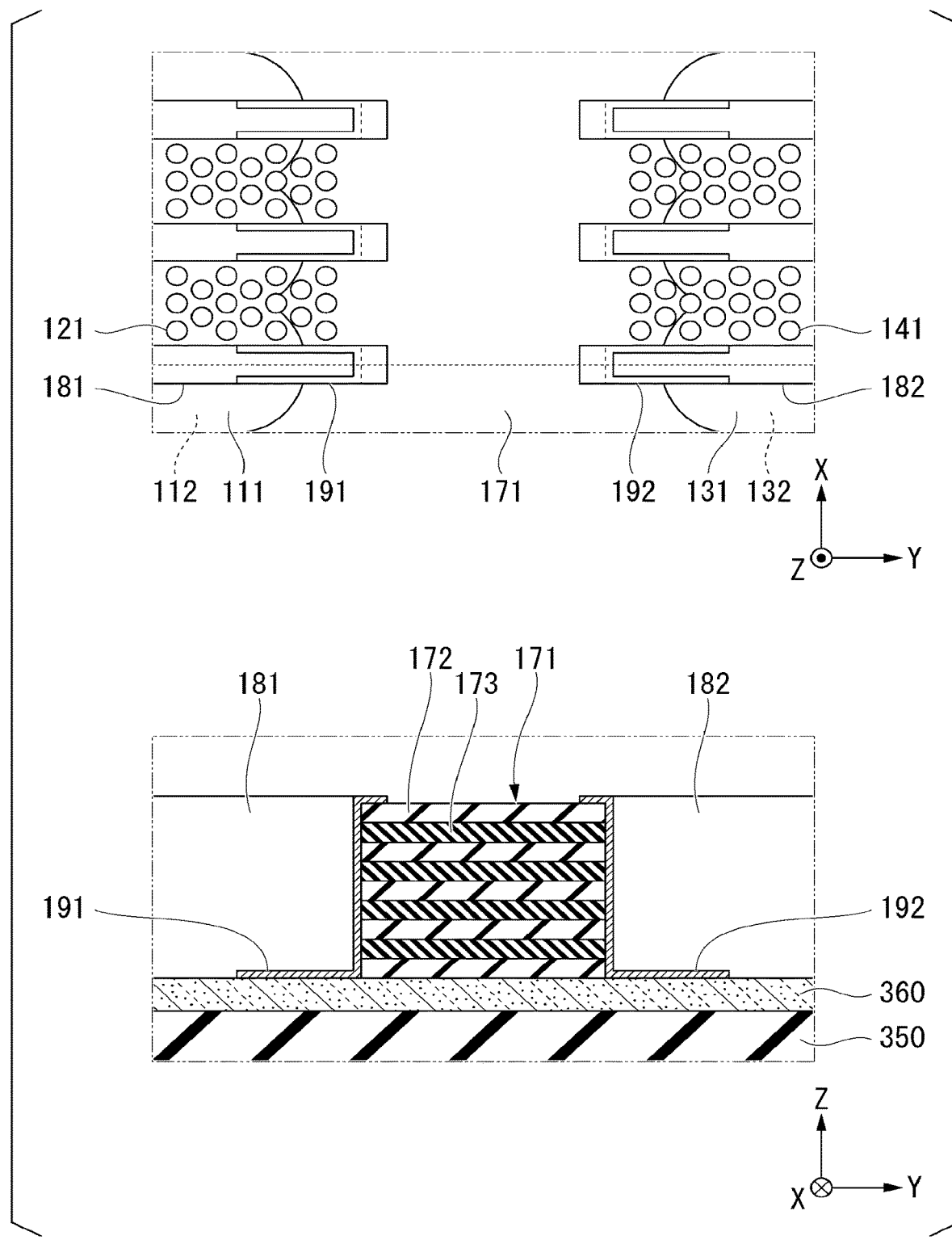
FIG. 11 is a plan view and a cross-sectional view showing a step involved in a manufacturing process for the memory cells of the semiconductor memory device of the first embodiment.

Subsequently, a portion of the insulating layer 402 on the first side in the Y-direction is replaced with the first conductive layer 112 by supplying a conductor such as tungsten to each of the plurality of gaps SS1. Similarly, a portion of the insulating layer 402 on the second side in the Y-direction is replaced with the second conductive layer 132 by supplying a conductor such as tungsten to each of the plurality of gaps SS2. Through the replacement thereof, a first stack 111 is formed on the first side of the third stack 171 in the Y-direction, and the second stack 131 is formed on the second side of the third stack 171 in the Y-direction as shown in FIG. 11.

Subsequently, the hole 421 is filled with a conductor such as tungsten, thereby forming the first pillar 121. The hole 441 is filled with a conductor such as tungsten, thereby forming the second pillar 141.

Subsequently, although not shown in the drawing, a plurality of holes are formed in the third stack 171 by patterning, etching, or the like. Each of the plurality of holes is dug in a direction opposite to the Z-direction inside the third stack 171 to penetrate the semiconductor layer 360 and intersect a predetermined conductive portion 314. The position of each of the plurality of holes formed in the X-direction and the Y-direction is the same as the position of each of the third pillars 211 of the semiconductor memory device 1. Each of the plurality of holes is filled with a conductor such as tungsten, thereby forming the plurality of third pillars 211 of the semiconductor memory device 1.

Subsequently, although not shown in the drawing, at least one hole is formed in the first stack 111 on the first side of the plurality of first pillars 121 in the Y-direction by patterning, etching, or the like. At least one hole is dug in a direction opposite to the Z-direction inside the first stack 111 to penetrate the semiconductor layer 360 and intersect a predetermined conductive portion 314. The position of at least one hole formed in the X-direction and the Y-direction is the same as the position of the third pillar 212 of the semiconductor memory device 1. At least one hole is filled with a conductor such as tungsten, thereby forming at least one third pillar 212 of the semiconductor memory device 1. In a manufacturing process for the third pillar 212, the first stack 111 on the first side of the plurality of first pillars 121 in the Y-direction is replaced with the second stack 131 on the second side of the plurality of second pillars 141 in the Y-direction, thereby forming at least one third pillar 213 of the semiconductor memory device 1.

The main portions shown in FIGS. 3 and 4 can be manufactured by performing the above-described process. The semiconductor memory device 1 is formed by performing known pre-processing before the above-described process and performing known post-processing after the above-described process. However, the method of manufacturing the semiconductor memory device 1 is not limited to the above-described method.

Subsequently, operational effects of the semiconductor memory device 1 of the first embodiment described above will be described. In the semiconductor memory device 1 of the first embodiment, the third stack 171 is provided between the first stack 111 and the second stack 131 in the Y-direction. A semiconductor memory device of the related art has a configuration in which a first stack 111 and a second stack 131 are connected to each other in a Y-direction without providing a third stack 171. In the semiconductor memory device 1 of the first embodiment, a plurality of word lines formed to have a so-called regular staircase shape at each of an edge portion on the first side and an edge portion on the second side in the Y-direction are electrically divided at the approximately central portion in the Y-direction, so that the length of the word line in the Y-direction is substantially reduced by approximately half as compared with a semiconductor memory device of the related art. Therefore, according to the semiconductor memory device 1 of the first embodiment, it is possible to reduce the length of a word line in the Y-direction and reduce a resistance of the word line as compared with a semiconductor memory device of the related art, and thus an improvement in electrical characteristics can be achieved.

In addition, according to the semiconductor memory device 1 of the first embodiment, it is possible to separate a plurality of word lines in the Y-direction by replacing an edge portion of the insulating layer 402 on a first side in the Y-direction and an edge portion thereof on a second side with the first conductive layer 112 and the second conductive layer 132 as described in the above-described method of manufacturing a main portion without performing special processing to form a longitudinal slit or the like.

In addition, according to the semiconductor memory device 1 of the first embodiment, the third stack 171 can be used as a portion for forming at least one or more third pillars 211.

Second Embodiment

Next, a configuration of a semiconductor memory device according to a second embodiment will be described. Although not shown in the drawing, the semiconductor memory device of the second embodiment is a three-dimensional NAND flash memory, similar to the semiconductor memory device 1 of the first embodiment. Hereinafter, with regard to components of the semiconductor memory device of the second embodiment, only contents different from those of the components of the semiconductor memory device 1 will be described, and a detailed description of contents which are common to those of the components of the semiconductor memory device 1 will be omitted.

Figure 12:
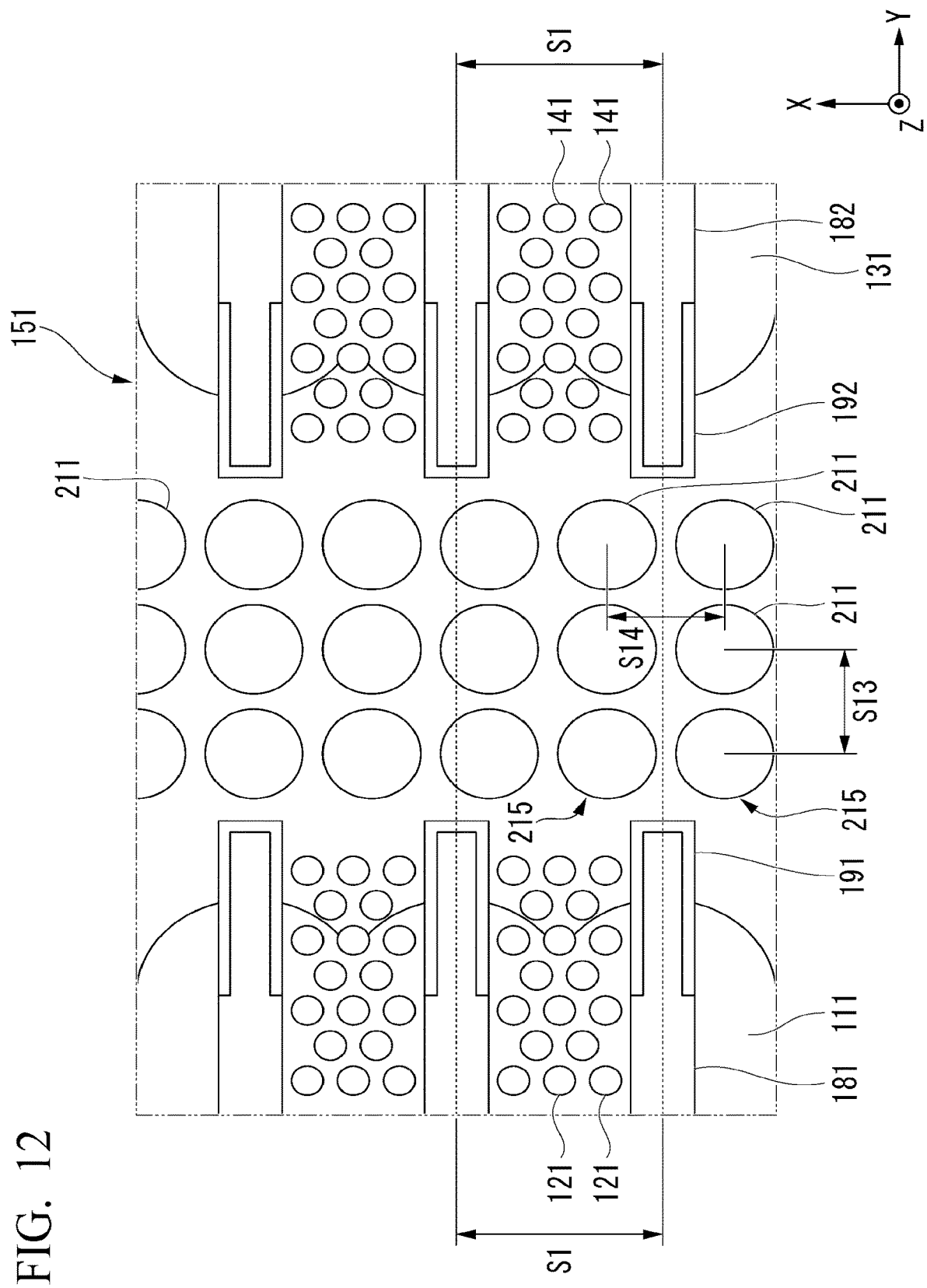
FIG. 12 is a plan view of memory cells of a semiconductor memory device of a second embodiment.

FIG. 12 is a plan view of a main portion of the semiconductor memory device of the second embodiment. As shown in FIG. 12, pillars 215 of a first group do not have a relative positional relationship between a plurality of first slits 181 and a plurality of second slits 182 in the X-direction and are lined up along the X-direction. A fourth interval S14 is shorter than a first interval S1. The plurality of pillars 215 of the first group are lined up so as to overlap each other in the Y-direction. That is, a larger number of third pillars 211 than that in the semiconductor memory device 1 of the first embodiment are formed in the semiconductor memory device of the second embodiment.

A main portion of the semiconductor memory device of the second embodiment can be manufactured by performing a process similar to that in the method of manufacturing a main portion of the semiconductor memory device 1 of the first embodiment. However, a plurality of holes for forming the plurality of third pillars 211 are formed so as to match the formation positions of the plurality of third pillars 211 shown in FIG. 12 and overlap each other in each of the X-direction and the Y-direction at the fourth interval S14 shorter than the first interval S1 in the X-direction and at a third interval S13 in the Y-direction.

Since the semiconductor memory device of the second embodiment has the same configuration as that of the semiconductor memory device 1 of the first embodiment, an improvement in electrical characteristics can be achieved. In addition, according to the semiconductor memory device of the second embodiment, the same effects as those of the semiconductor memory device 1 of the first embodiment can be obtained.

In addition, according to the semiconductor memory device of the second embodiment, a larger number of third pillars 211 can be formed in the third stack 171 than before relative positions of the plurality of third pillars 211 are changed by changing the positions of the plurality of third pillars 211.

Although the embodiments of the present invention have been described above, those embodiments are described as examples, and do not limit the scope of the invention. The above-described embodiments may be embodied in other various modes, and may be variously omitted, substituted, and modified without departing from the scope of the invention. Those embodiments and modification thereof are within the scope and the gist of the invention, and are within the scope of the invention described in the scope of claims and the equivalent thereof.

For example, the number and disposition of the plurality of third pillars 211 formed in the third stack 171 are not limited to the number and disposition of the plurality of third pillars 211 described in the above-described first and second embodiments and are freely changed.

For example, in the above-described embodiments, the plurality of third pillars 211 are formed in the third stack 171, at least one third pillar 212 is formed in the first stack 111, and at least one third pillar 213 is formed in the second stack 131. However, if the number of third pillars 211 formed in the third stack 171 are sufficiently secured, the third pillars 212 and 213 may not be formed. An interval in the Y-direction between a portion of the first stack 111 in which the plurality of first pillars 121 are formed and a portion of the first stack 111 in which the plurality of fourth pillars 221 are formed can be made smaller than that in a semiconductor memory device of the related art. Similarly, an interval in the Y-direction between a portion of the second stack 131 in which the plurality of second pillars 141 are formed and a portion of the second stack 131 in which the plurality of fifth pillars 231 are formed can be made smaller than that in a semiconductor memory device of the related art. Thereby, high-density integration of the semiconductor memory device can be achieved.

For example, in the above-described embodiments, the semiconductor layer 360 is formed in the silicon substrate 11 through the insulating interlayer 350 in the Z-direction. However, the first stack 111, the second stack 131, and the third stack 171 may be directly formed on the surface 350a of the insulating interlayer 350.

In the above-described embodiments, each of the first slit 181 and the second slit 182 are formed of a conductive material such as tungsten, but may be formed of an insulating material such as silicon oxide.

What is claimed is:

1. A semiconductor memory device comprising:
a substrate;
a first stack comprising a plurality of first conductive layers and a plurality of first insulating layers, which are alternately stacked in a thickness direction of the substrate, wherein a first side edge of a closer layer of the plurality of first conductive layers to the substrate is positioned outside a first side edge of a farther layer of the plurality of first conductive layers from the substrate in view of the thickness direction of the substrate;
a plurality of first pillars which extend inside the first stack in the thickness direction of the substrate;
a plurality of first memory cell transistors, each of which is positioned at a crossing position between the first conductive layer and each of the plurality of first pillars;
a second stack positioned on a second side with respect to the first stack, the second stack comprising a plurality of second conductive layers and a plurality of second insulating layers, which are alternately stacked in the thickness direction of the substrate, wherein the plurality of second conductive layers respectively have second side edges, which are different in position from each other in view of the thickness direction of the substrate, and wherein the second side edge of a closer second conductive layer of the plurality of second conductive layers to the substrate is positioned outside the second side edge of a farther second conductive layer of the plurality of second conductive layers from the substrate;
a plurality of second pillars which extend inside the second stack in the thickness direction of the substrate;
a plurality of second memory cell transistors, each of which is positioned at a crossing position between the second conductive layer and each of the second pillars; and
a third stack positioned between the first stack and the second stack in a first direction, the third stack comprising a plurality of third insulating layers and a plurality of fourth insulating layers, which are different in material from each other, and which are alternately stacked in the thickness direction of the substrate.

2. The semiconductor memory device according to claim 1, wherein the third insulating layer includes the same material as those of the first insulating layer and the second insulating layer.

3. The semiconductor memory device according to claim 1, wherein
the third insulating layer is connected to the first insulating layer and the second insulating layer, and
the fourth insulating layer is connected to the first conductive layer and the second conductive layer.

4. The semiconductor memory device according to claim 1, further comprising:
a plurality of first slits positioned inside the first stack at a first interval along a surface of the substrate in a second direction crossing the first direction, wherein each of the plurality of first slits extends vertically from the surface of the substrate; and a plurality of second slits positioned inside the second stack at the first interval in the second direction, wherein each of the plurality of second slits extends vertically from the surface of the substrate, wherein the third stack includes portions which are positioned between the plurality of first slits and the plurality of second slits in the first direction.

5. The semiconductor memory device according to claim 4, wherein at least one first slit included in the plurality of first slits includes a first extending portion which extends toward the second side from a second side edge of the first conductive layer and which extends inside the third stack, and at least one second slit included in the plurality of second slits includes a second extending portion which extends toward the first side from a first side edge of the second conductive layer and which extends inside the third stack.

6. The semiconductor memory device according to claim 5, further comprising:

a first film extending on a second side edge face of each of the plurality of first slits and extending on a part of a first side surface adjacent to the second side edge face, the first film being more resistant to at least one type of etchant for removing the fourth insulating layer than the fourth insulating layer; and a second film extending on a first side edge face of each of the plurality of second slits and extending on a part of a second side surface adjacent to the first side edge face, the second film being more resistant to at least one type of etchant for removing the fourth insulating layer than the fourth insulating layer.

7. The semiconductor memory device according to claim 6, wherein a portion of the first film which extends toward the first side from a first side edge of the fourth insulating layer and which is positioned inside the first stack, and a portion of the second film which extends toward the second side from a second side edge of the fourth insulating layer and which is positioned inside the second stack.

8. The semiconductor memory device according to claim 5, further comprising:

a first film extending on a second side edge face of each of the plurality of first slits on the second side and extending on a part of a first side surface adjacent to the second side edge face, the first film including one or more of the group consisting of silicon oxide, polysilicon, amorphous silicon, and boron nitride; and a second film extending on a first side edge face of each of the plurality of second slits and extending on a part of a second side surface adjacent to the first side edge face, the second film including one or more of the group consisting of silicon oxide, polysilicon, amorphous silicon, and boron nitride.

9. The semiconductor memory device according to claim 4, wherein a minimum width of the third stack in the first direction is larger than a maximum width of one of the plurality of first slits in the second direction and larger than a maximum width of one of the plurality of second slits in the second direction.

10. The semiconductor memory device according to claim 1, wherein the third insulating layer includes silicon oxide, and the fourth insulating layer includes silicon nitride.

11. The semiconductor memory device according to claim 4, wherein a first side edge of the fourth insulating layer in a cross-section parallel to the surface of the substrate includes a first inclined portion which is inclined toward the first side from one of two of the plurality of first slits toward an intermediate position between the two of the plurality of first slits in the second direction intersecting the first direction, and a second side edge of the fourth insulating layer in a cross-section parallel to the surface of the substrate includes a second inclined portion which is inclined toward the second side from one of two of the plurality of second slits toward an intermediate position between the two second slits in the second direction.

12. The semiconductor memory device according to claim 1, further comprising:

at least one third pillar which extends inside the third stack in the thickness direction of the substrate and is electrically connected to the substrate.

13. The semiconductor memory device according to claim 12, wherein the at least one third pillar includes at least three third pillars, and the at least three pillars are aligned at a third interval in the first direction.

14. The semiconductor memory device according to claim 12, wherein a width of the first pillar in the first direction and a width of the second pillar in the first direction are smaller than a width of the third pillar in the first direction.

* * * * *